(12) United States Patent
Nakajima et al.

(10) Patent No.: US 10,483,419 B2
(45) Date of Patent: Nov. 19, 2019

(54) SOLAR CELL MODULE AND METHOD OF MANUFACTURING THE SOLAR CELL MODULE

(75) Inventors: Takaaki Nakajima, Budapest (HU); Atsushi Nakauchi, Izumiotsu (JP); Teruhiko Ienaga, Izumisano (JP); Shingo Okamoto, Toyonaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 462 days.

(21) Appl. No.: 12/124,238

(22) Filed: May 21, 2008

(65) Prior Publication Data

US 2008/0295881 A1 Dec. 4, 2008

(30) Foreign Application Priority Data

May 29, 2007 (JP) .................. 2007-142467

(51) Int. Cl.
*H01L 31/02* (2006.01)
*H01L 31/05* (2014.01)

(52) U.S. Cl.
CPC .......... *H01L 31/0504* (2013.01); *H01L 31/02* (2013.01); *H01L 31/0201* (2013.01); *Y02E 10/50* (2013.01)

(58) Field of Classification Search
USPC .................... 136/243–265; 438/57
See application file for complete search history.

(56) References Cited

U.S. PATENT DOCUMENTS

| 6,218,606 B1 | 4/2001 | Morizane et al. |
| 6,521,825 B2 * | 2/2003 | Miura et al. .................. 136/251 |
| 6,635,507 B1 * | 10/2003 | Boutros et al. ................. 438/57 |
| 8,067,295 B2 | 11/2011 | Yagiura et al. |
| 2006/0219291 A1 * | 10/2006 | Hikosaka ............... H02S 20/00 136/251 |
| 2007/0074756 A1 | 4/2007 | Yagiura et al. |

FOREIGN PATENT DOCUMENTS

| DE | 35 29 341 A1 | 2/1987 |
| EP | 1 840 976 A1 | 10/2007 |
| JP | 61-082485 | 4/1986 |
| JP | 2000-101122 A | 4/2000 |
| JP | 2000-277784 A | 10/2000 |
| JP | 2002-359388 A | 12/2002 |
| JP | 2004-263544 A | 9/2004 |
| JP | 2005-011869 | 1/2005 |

(Continued)

OTHER PUBLICATIONS

Office action dated Dec. 7, 2017 for a counterpart European patent application No. 11170406.0.

(Continued)

*Primary Examiner* — Dustin Q Dam
(74) *Attorney, Agent, or Firm* — Metrolex IP Law Group, PLLC

(57) ABSTRACT

On a projected plane in parallel to the main surface of the solar cell module 100, an output interconnection 10 includes: a first output interconnection section 10a arranged along an conductive member 4 in a power non-generating field; and a second output interconnection section 10b leading to the first output interconnection section 10a in a power generating section X.

23 Claims, 9 Drawing Sheets

(56) References Cited

FOREIGN PATENT DOCUMENTS

| | | |
|---|---|---|
| JP | 2005-209985 | 8/2005 |
| JP | 2005-244046 A | 9/2005 |
| JP | 2006-019440 A | 1/2006 |
| JP | 2006-278699 A | 10/2006 |
| JP | 2006-278904 A1 | 10/2006 |
| JP | 2006-278905 | 10/2006 |
| JP | 2007-103537 A | 4/2007 |
| JP | 2007-123848 A | 5/2007 |

OTHER PUBLICATIONS

An official communication dated Oct. 19, 2018 in a counterpart European patent application No. 08251830.9.

* cited by examiner

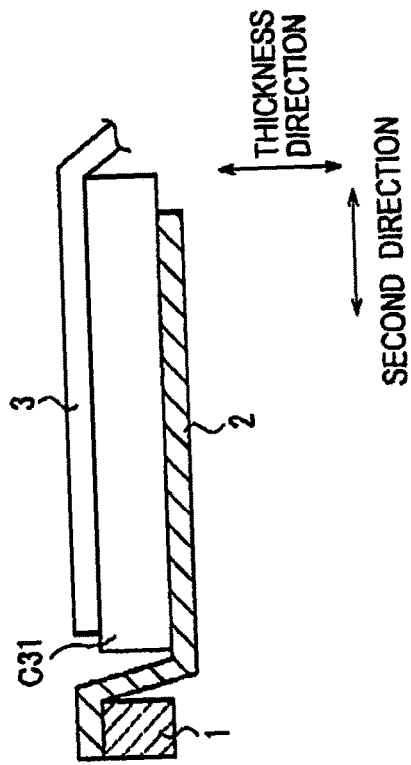
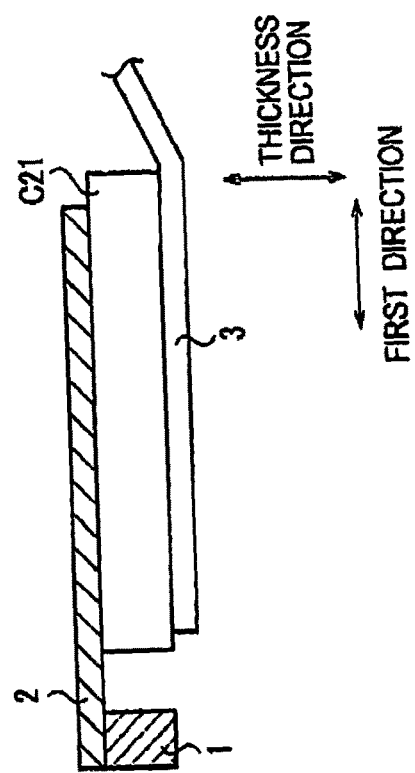
FIG. 7A
FIG. 7B

SOLAR CELL MODULE AND METHOD OF MANUFACTURING THE SOLAR CELL MODULE

CROSS REFERENCE TO RELATED APPLICATIONS

This application is based upon and claims the benefit of priority from the prior Japanese Patent Application No. P 2007-142467, filed on May 29, 2007; the entire contents of which are incorporated herein by reference.

BACKGROUND OF THE INVENTION

1. Field of the Invention

The present invention relates to a solar cell module including a power generating field and output interconnections through which electric power is outputted from the power generating field, and to a method of manufacturing the solar cell module.

2. Description of the Related Art

A solar cell is expected to be an alternative energy source because the solar cell can directly convert sun light, which is an unlimited source of clean energy, into electricity.

Such a solar cell outputs electric power of only approximately several watts. For this reason, in a case where solar cells are intended to be used as an electric power source (or an energy source) for a house, a building or the like, a solar cell module in which multiple solar cells are arrayed is used instead.

Generally speaking, the solar cell module includes: a power generating field formed by arraying multiple solar cells; and paired positive and negative output interconnections, connected to the power generating field, through which electric power is outputted from the power generating field to the outside of the solar cell module.

In this respect, a publicly-known example of a conventional type of solar cell module includes the output interconnections, which are arranged along an outer periphery of the power generating field (see Japanese Patent Application Publication No. 2006-278904). Such a solar cell module has a terminal box, which is arranged on its back surface. The output interconnections extend along the outer periphery of the power generating field from the respective positions where the output interconnections are connected to the power generating field to the respective different positions which makes it easy for the output interconnections to be drawn out to the terminal box.

SUMMARY OF THE INVENTION

A first characteristic of the present invention is a solar cell module including a power generating field, a power non-generating field and at least one output interconnection. The power generating field includes: a light receiving surface for receiving light; and a back surface provided on the opposite side of the light receiving surface. The power generating field generates electric power by receiving light. The power non-generating field is formed outside the power generating field. The output interconnection outputs therethrough the electric power generated in the power generating field to the outside of the solar cell module. The first characteristic thereof has the following gist. The power generating field includes multiple solar cell groups each formed by arraying multiple solar cello in a first direction. The multiple solar cell groups are arranged one after another in a second direction almost orthogonal to the first direction. The output interconnection is electrically connected to an output solar cell group included in the multiple solar cell groups by use of a conductive member. The conductive member extends to the power non-generating field while connecting to the output solar cell group. The output interconnection is electrically connected to the conductive member in the power non-generating field, and extends to the back surface of the power generating field. On a projected plane in parallel to the main surface of the solar cell module, the output interconnection includes: a first output interconnection section provided along the conductive member in the power non-generating field; and a second output interconnection section led to the first output interconnection section in the power generating field.

As described above, the output interconnection extends to the back surface of the power generating field from a position where the output interconnection is connected to the conductive member in the power non-generating field. In other words, the output interconnection is not drawn outside the power generating field. This makes it possible to increase the ratio of the area of the power generating field to the area of the solar cell module. As a result, this makes it possible to increase the amount of power generation per unit area of the solar cell module.

In the first characteristic of the present invention, the solar cell module may include a solar cell group connecting member for electrically connecting a first and second solar cell groups to each other, included in the multiple solar cell groups, to each other; the solar cell group connecting member may be provided in the power non-generating field; the width of the output interconnection should be larger than the width of the solar cell group connecting members; and the thickness of the output interconnection may be smaller than the thickness of the solar cell group connecting member.

In the first characteristic of the present invention, the conductive member may include: a first conductive section extending to the power non-generating field while electrically connected to the output solar cell group; a second conductive section, being arranged alongside the first conductive section in the second direction, and extending to the power non-generating field while electrically connected to the output solar cell group; and a third conductive section for electrically connecting the first and the second conductive sections to each other in the power non-generating field. Concurrently, the output interconnection may be connected to the third conductive section; and on the projected plane in parallel to the main surface of the solar cell module, the output interconnection may not intersect the first or the second conductive section at the boundary between the power generating field and the power non-generating field.

In the first characteristic of the present invention, on the projected plane in parallel to the main surface of the solar cell module, the second output interconnection section may not intersect a boundary between the power generating field and the power non-generating field.

In the first characteristic of the present invention, a cushioning member may be arranged between the second output interconnection section and at least a part of the power generating field.

In the first characteristic of the present invention, an insulation treatment may be applied to at least a part of the second output interconnection section.

A second characteristic of the invention is the solar cell module according to the first characteristic of the present invention, and has the following gist. The solar cell module further includes: a first interconnection member for electrically connecting the first solar cell group and the solar cell group connecting member to each other; a second interconnection member for electrically connecting the second solar cell group and the solar cell group connecting member to each other; a bypass diode connecting interconnection electrically connected to the solar cell group connecting member. The bypass diode connecting interconnection extends to the back surface of the power generating field from a position where the bypass diode connecting interconnection is connected to the solar cell group connecting member. On the projected plane in parallel to the main surface of the solar cell module, the bypass diode connecting interconnection includes: a first bypass diode connecting interconnection section provided along the first and the second interconnection members in the power non-generating field; and a second bypass diode connecting interconnection section led to the first bypass diode connecting interconnection section in the power generating field.

In the second characteristic of the present invention, the width of the bypass diode connecting interconnection may be larger than the width of the solar cell group connecting member; and the thickness of the bypass diode connecting interconnection may be smaller than the thickness of the solar cell group connecting member.

In the second characteristic of the present invention, on the projected plane in parallel to the main surface of the solar cell module, the second output interconnection section and the second bypass diode connecting interconnection section may not intersect each other.

In the second characteristic of the present invention, on the projected plane in parallel to the main surface of the solar cell module, the second bypass diode connecting interconnection section may not intersect a boundary between the power generating field and the power non-generating field.

In the second characteristic of the present invention, a cushioning member may be arranged between the second bypass diode connecting interconnection section and at least a part of the power generating field.

In the second characteristic of the present invention, an insulation treatment may be applied to at least a part of the second bypass diode connecting interconnection section.

A third characteristic of the present invention is a method of manufacturing a solar cell module, and has the following gist. The method includes: the step A of: forming multiple solar cell groups, in each of which multiple solar cells are arrayed in a first direction; the step B of electrically connecting an conductive member extending to an output solar cell group included in the multiple solar cell groups, the conductive member extending to the outside of the output solar cell group; the step C of forming a power generating field by arranging the multiple solar cell groups one after another in a second direction almost orthogonal to the first direction, the power generating field including a light receiving surface for receiving light and a back surface provided on the opposite side of the light receiving surface, and the power generating field being that for generating electric power by receiving light; and the step D of electrically connecting an output interconnection to the conductive member outside the power generating field, the output interconnection being that through which the electric power generated in the power generating field is outputted to the outside of the solar cell module. In the step D, the output interconnection extends to the back surface of the power generating field; and on a projected plane in parallel to the main surface of the solar cell module, the output interconnection includes a first output interconnection section arranged along the conductive member outside the power generating field, and a second output interconnection section led to the first output interconnection section in the power generating field.

In the third characteristic of the present invention, in the step A, each of the plurality of solar cells may include a first principal surface and a second principal surface provided on the opposite side of the first principal surface, the second principal surface may have the opposite polarity from a polarity of the first principal surface, and the plurality of solar cells may be arranged in a way that the first principal surfaces of the plurality of solar cells face in the same direction. In the step B, a first interconnection member may be electrically connected to a first solar cell located at an end of the first solar cell group included in the plurality of solar cell groups, in a way that the first interconnection member may extend to an outside of a first solar cell group; and a second interconnection member may be electrically connected to a second solar cell located at an end of the second solar cell group included in the plurality of solar cell groups, in a way that the second interconnection member may extend to an outside of a second solar cell group, and a part of the first interconnection member may be folded along a side surface of the first solar cell in a thickness direction of the first solar cell. In the step C, outside the power generating field, a solar cell group connecting member for electrically connecting the first and the second cell groups to each other may be electrically connected to the first and the second interconnection members.

BRIEF DESCRIPTION OF THE DRAWINGS

FIGS. 7A and 7B are cross sectional view used for the purpose of explaining a solar cell group connecting member 1 connected to an interconnection member 2.

DESCRIPTION OF THE PREFERRED EMBODIMENT

Figure 1:
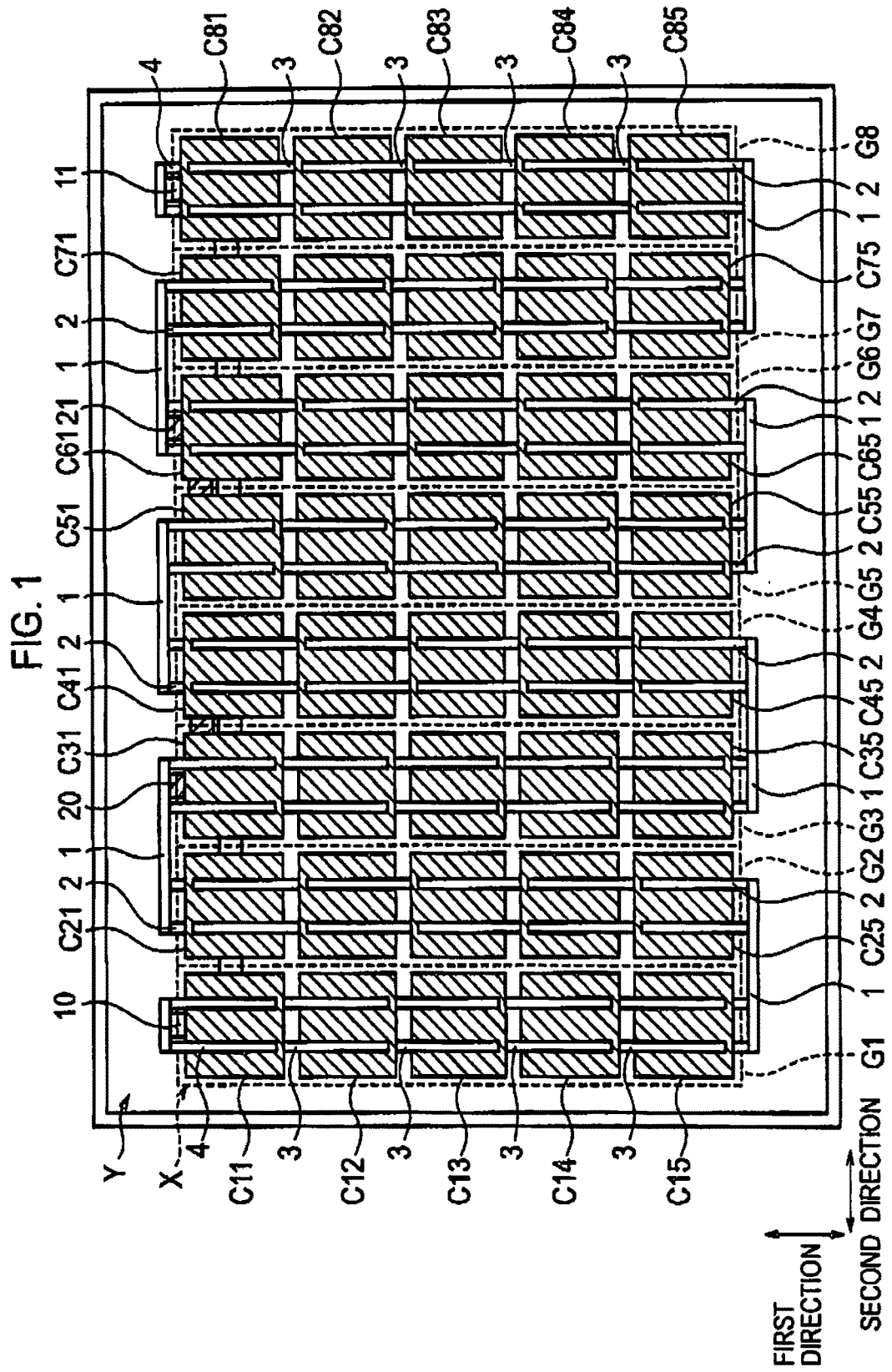
FIG. 1 is a front view of a solar cell module 100 according to an embodiment of the present invention.

Descriptions will be subsequently provided for an embodiment of the present invention by use of the drawings. In any one of the drawings, components which are the same as or similar to those in any other of the drawings are denoted by the same or similar reference numerals. It should be noted that the drawings are schematic, and that dimensional ratios in the drawings are accordingly different from the actual ones. For this reason, concrete dimensions and the like should be estimated with the subsequent descriptions taken into consideration. Furthermore, it goes without saying that dimensional relationships and ratios are different from one drawing to another.

(Configuration of Solar Cell Module)

Figure 2:
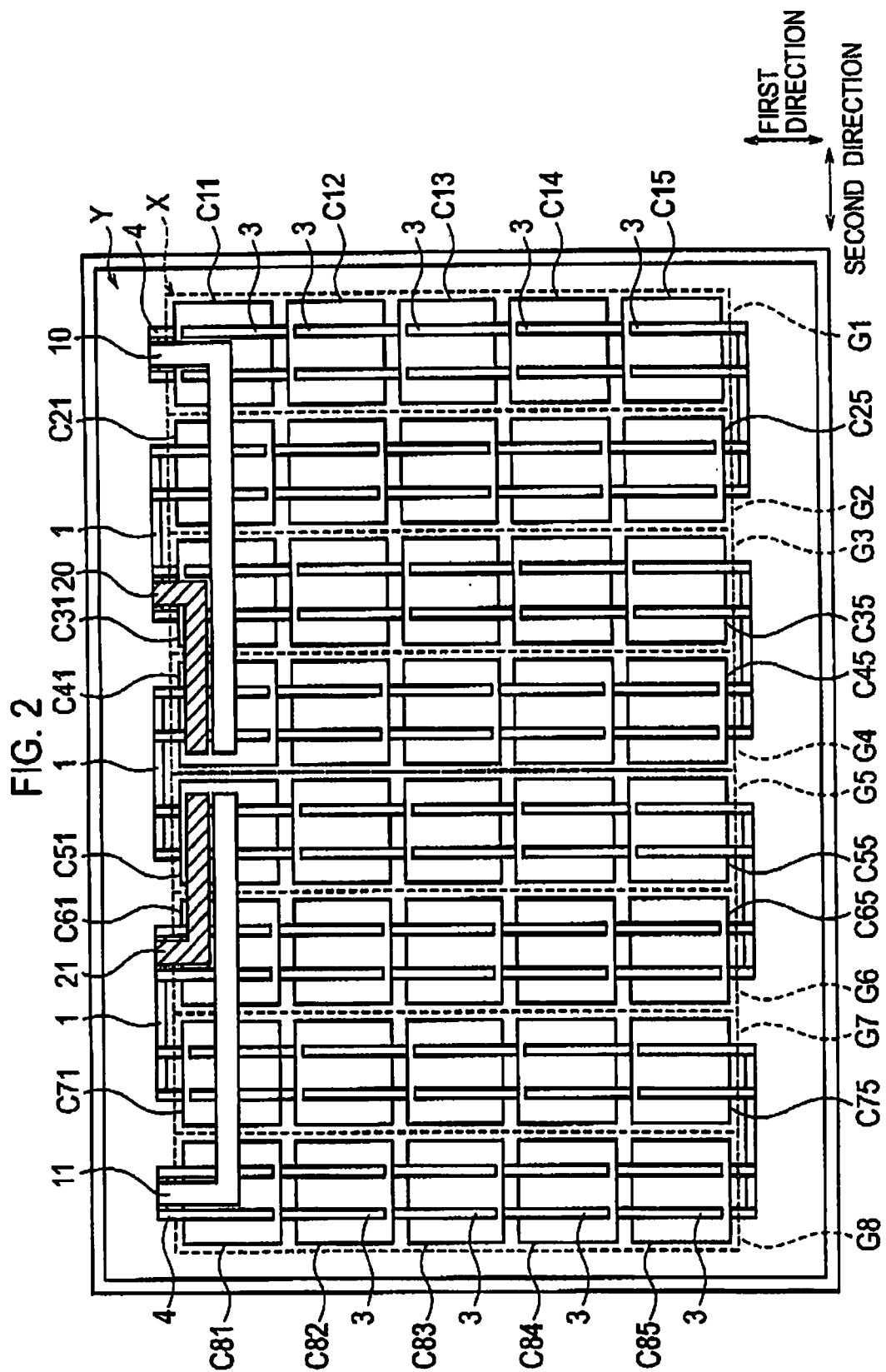
FIG. 2 is a back view of the solar cell module 100 according to the embodiment of the present invention.

Descriptions will be provided hereinbelow for a configuration exemplifying a solar cell module 100 according to an embodiment of the present invention by referring to FIGS. 1 and 2. FIG. 1 is a front view showing the configuration of the solar cell module 100. FIG. 2 is a back view showing the configuration of the solar cell module 100.

The solar cell module 100 according to an embodiment includes: a power generating field X; a power non-generating field Y; output interconnections 10 and 11 through which electric power generated in the power generating field X is outputted to the outside of the solar cell module 100; and bypass diode connecting interconnections 20 and 21 each connected to a bypass diode.

The power generating field X has 8 solar cell groups G1 to G8 each formed by arraying 5 solar cells C in a first direction. In other words, the power generating field X is formed by arranging solar cells C in an 8×5 matrix. Each solar cell C has a light receiving surface for receiving light and a back surface which is provided at the other side of the light receiving surface. Each solar cell C generates electric power by receiving light. As a result, the power generating field X formed by arranging the solar cells C in the 8×5 matrix similarly has a light receiving surface and a back surface, and generates electric power by receiving light. Note that the light receiving surface and the back surface of each solar cell C have opposite polarity, respectively. The light receiving surfaces of solar cells C have the same polarity. Though not illustrated, connecting electrodes are formed on the light receiving surface and the back surface of the solar cell C. A solar cell connecting member 3 described below is connected on each of the connecting electrodes.

The solar cell groups G1 to G8 are arrayed in a second direction almost orthogonal to the first direction in which the solar cells C are arrayed. Each of two neighboring solar cell groups G arrayed in the second direction is electrically connected to each other in series by use of a solar cell group connecting member 1. The number of solar cell group connecting members 1 is seven. The seven solar cell group connecting members 1 are set in the power non-generating field Y. Each of solar cell group connecting members 1 is electrically connected to two neighboring solar cell groups by use of interconnection members 2. A bypass diode connecting interconnection 20 is electrically connected to a corresponding one of the solar cell group connecting members 1. Descriptions will be provided later for the interconnection configuration of a solar cell group connecting member 1, an interconnection member 2, and a bypass diode connecting interconnection 20.

Each of the solar cell groups G1 to G8 includes 5 solar cells C that are arrayed in the first direction and solar cell connecting members 3 that electrically connects the 5 solar cells C one to another in series.

As shown in FIGS. 1 and 2, paired positive and negative interconnections 10 and 11 are electrically connected to the solar cell groups G1 and G8 located at the both ends of the power generating field X in the second direction through conductive members 4, respectively. In the case of the present embodiment, the solar cell groups G1 and G8 are referred to as output solar cell groups G1 and G8.

The output solar cell group G1 includes solar cells C11 to C15, and the output solar cell group G8 includes solar cells C81 to C85. Similarly, another solar cell group G2 includes solar cells C21 to C25; yet another solar cell group G3, solar cells C31 to C35; . . . ; and the other solar cell groups G7, solar cells C71 to C75.

First of all, descriptions will be provided for the output solar cell group G1. The 5 solar cells C11 to C15 included in the output solar cell group G1 are arranged one after another in the first direction. Each of the solar cells C11 to C15 are electrically connected one to another in series, by the solar cell connecting members 3. Specifically, the 2 solar cell connecting members 3 are electrically connected to the connecting electrode provided on the light receiving surface of the solar cell C11 and the connecting electrode provided on the back surface of the solar cell C12. The same holds for the solar cells C12 to C15. The number of solar cell connecting members 3 included in the output solar cell group G1 is 2×4.

The output interconnection 10 is electrically connected to the output solar cell group G1 through the conductive member 4. The conductive member 4 is connected to the output solar cell group G1, and extends to the power non-generating field Y. The conductive member 4 is connected to the connecting electrode provided on the light receiving surface of the solar cell C11 located at one end of the output solar cell group G1 in the first direction. Descriptions will be provided for the interconnection configuration of the conductive member 4 and the output interconnection 10 later. It should be noted that a corresponding one of the solar cell group connecting members 1 is electrically connected to the solar cell C15 located at the other end of the output solar cell group G1 in the first direction through the interconnection members 2.

The output solar cell group G8 includes 5 solar cells C81 to G85 and 4 solar cell connecting members 3, and has the same configuration as the output solar cell group G1. The output interconnection 11 is electrically connected to the output solar cell group G8 through an conductive member 4. The conductive member 4 is connected to the connecting electrode provided on the back surface of the solar cell C81.

Each of the solar cell groups G2 to G7 includes 5 solar cells C and 4 solar cell connecting members 3, and has the same configuration as the output solar cell groups G1 and G2, except that a corresponding one of the solar cell group connecting member 1 is electrically connected to each of the solar cells C located at the both ends of each of the solar cell group G2 to G7 in the first direction through the interconnection members 2.

Figure 3:
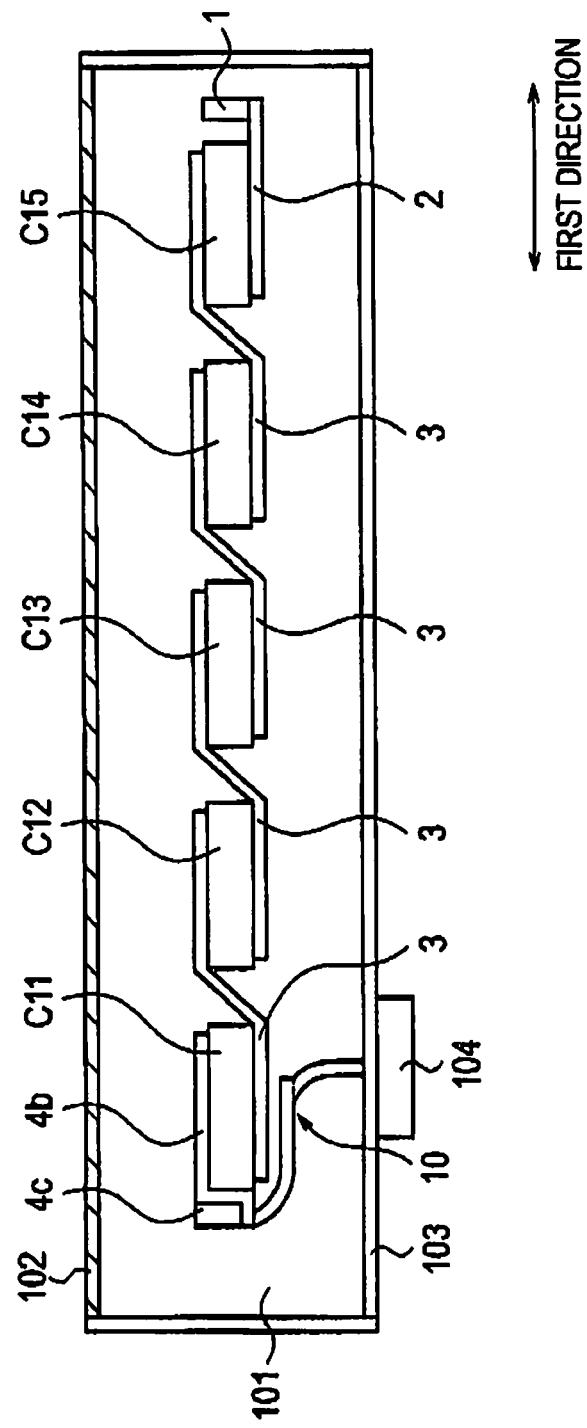
FIG. 3 is a side view of the solar cell module 100 according to the embodiment of the present invention.

FIG. 3 shows a side view of the solar cell module 100 having the foregoing configuration. As shown in FIG. 3, the solar cell module 100 includes: the multiple solar cells C (only the solar cells C11 to C15 are illustrated) arranged in the 8×5 matrix; a sealing member 101; a light receiving surface-side protecting member 102; the back surface-side protecting members 103; and a terminal box 104.

The multiple solar cells C arranged in the 8×5 matrix, or the 8 solar cell groups G1 to G8 constituting the power generating field X, are sealed by the sealing member 101. A translucent resin such as an EVA, EEA, PVB, silicon, urethane, acrylic, epoxy resin or the like can be used for the sealing member 101.

The light receiving surface-side protecting member 102 is arranged on the sealing member 101 at the side of the light receiving surface. A translucent and water-impermeable glass, a translucent plastic or the like can be used for the light receiving surface-side protecting member 102.

The back surface-side protecting member 103 is arranged on the sealing member 101 at the side of the back surface.

A resin film made of a resin such as a PET (polyethylene terephthalate) resin, or a laminated film obtained by sandwiching an Al foil with resin films can be used for the back surface-side protecting member 103.

A terminal box 104 is arranged on the back surface of the solar cell module 100. The paired positive and negative output interconnections 10 and 11 as well as the bypass diode connecting interconnections 20 and 21 are guided to a bypass diode (not illustrated) housed in the terminal box 104. In the case of the present embodiment, the terminal box 104 is arranged in a position which causes the terminal box 104 to overlap the solar cells C41 and C51 on the projected plane in parallel to the main surface of the solar cell module 100. The position of the terminal box 104 can be changed whenever deemed necessary depending on the shapes respectively of the solar cell module 100, the power generating field X and the like.

An Al frame can be attached to the periphery of the solar cell module 100 having the foregoing configuration.

(Interconnection Configuration of Conductive Member 4 and Output Interconnection 10)

Figure 4:
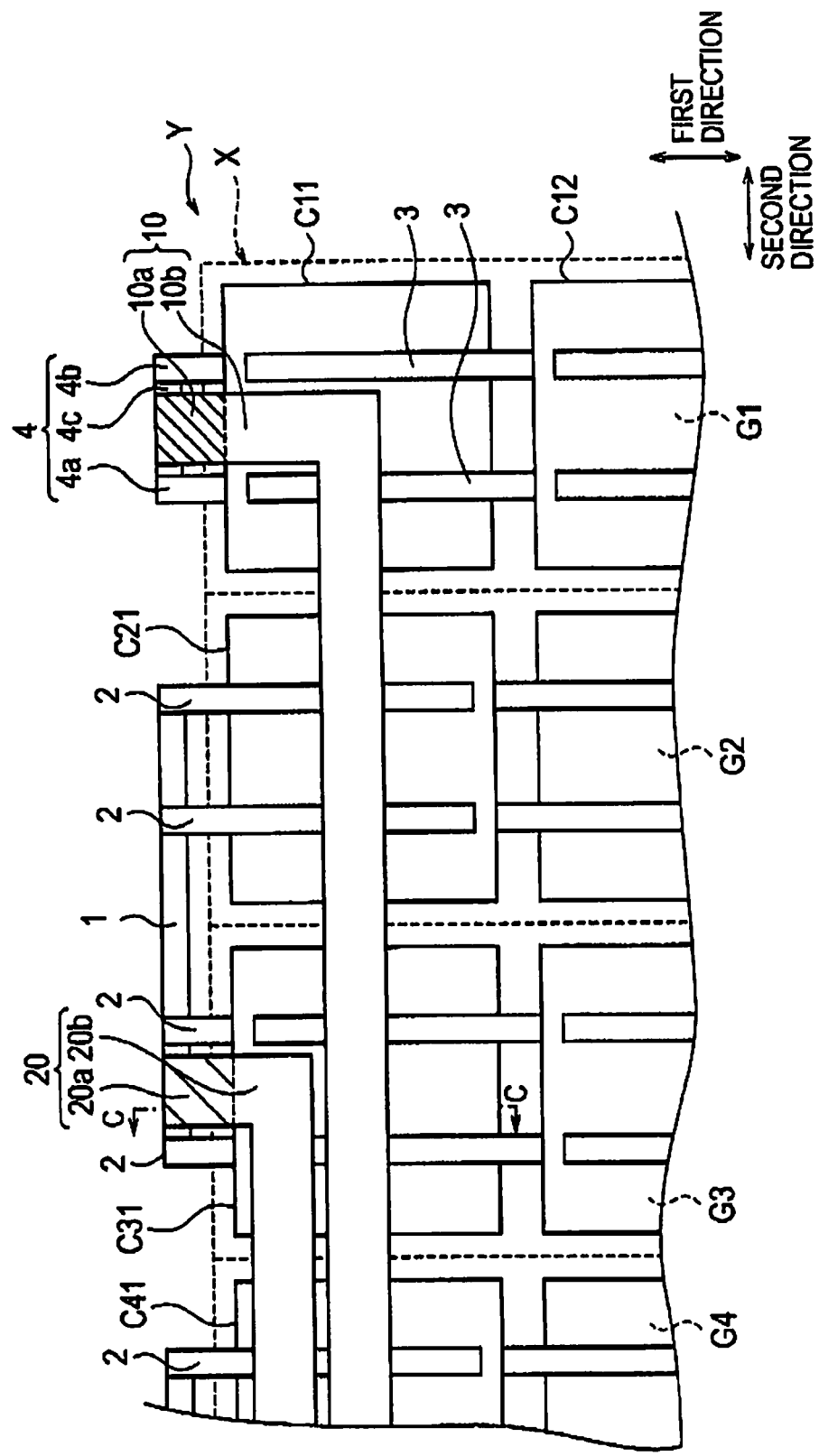
FIG. 4 is a magnified view of solar cells C11, C21, C31 and C41 as well as their vicinity shown in FIG. 2.

Descriptions will be subsequently provided for an interconnection configuration of the conductive member 4 and the output interconnection 10 by referring to FIG. 4. FIG. 4 is a magnified view of the solar cells C11, C21, C31 and C41 as well as their vicinity shown in FIG. 2.

As shown in FIG. 4, the conductive member 4 includes a first conductive section 4a, a second conductive section 4b and a third conductive section 4c. The first and second conductive section 4a and 4b are electrically connected to the light receiving surface of the solar cell C11, and extend to the power non-generating field Y. The third conductive section 4c electrically connects the first and the second conductive sections 4a and 4b to each other in the power non-generating field Y.

The output interconnection 10 is connected to the third conductive section 4c by use of an conductive adhesive such as solder. In this manner, the output interconnection 10 is electrically connected to the solar cell C11 (or the output solar cell group G1) through the conductive member 4.

The output interconnection 10 extends toward the back surface of the solar cell C11, or toward the back surface of the power generating field X, from the position in the power non-generating field Y where the output interconnection 10 is connected to the third conductive section 4c by use of solder. As a result, as shown in FIG. 4, on the projected plane in parallel to the main surface of the solar cell module 100, the output interconnection 10 includes: a first output interconnection section 10a provided along the conductive member 4 in the power non-generating field Y; and a second output interconnection section 10b provided in the power generating field X to connects to the first output interconnection section 10a. A cushioning member (not illustrated) for releasing stress produced in the module process is arranged between the second output interconnection section 10b and the power generating field X. An EVA resin or the like can be used for the cushioning member. In addition, an insulation treatment is applied to the surface of the second output interconnection section 10b.

In this respect, the output interconnection 10 does not intersect the first conductive section 4a or the second conductive sections 4b at the boundary between the power generating field X and the power non-generating field Y on the projected plane in parallel to the main surface of the solar cell module 100. Specifically, the output interconnection 10 is placed away from the first and the second conductive sections 4a and 4b at the end of the solar cell C11 in the first direction. The end of the solar cell C11 constitutes the boundary between the power generating field X and the power non-generating field Y.

The second output interconnection section 10b is arranged on the center of the back surface of each of the solar cells C11, C21, C31 and C41. The second output interconnection section 10b is placed away from the end of the solar cells C11, C21, C31 and C41 in the first direction. The end of the solar cells C11, C21, C31 and C41 constitute the boundary between the power generating field X and the power non-generating field Y. As a result, the second output interconnection 10b is placed the power generating field X The side line constitutes the boundary between the power generating field X and the power non-generating field Y. In addition, the output interconnection 10 is located near the center on the projected plane in parallel to the main surface of the solar cell module 100.

(Interconnection Configuration of Solar Cell Group Connecting Members 1, Interconnection Members 2 and Bypass Diode Connecting Interconnection 20)

Descriptions will be subsequently provided for an interconnecting configuration of a solar cell group connecting member 1, interconnection members 2 and a bypass diode connecting interconnection 20 by referring to FIG. 4.

As shown in FIG. 4, two interconnection members 2 are connected to the solar cell group G2, and extend to the power non-generating field Y in the first direction. Specifically, the two interconnection members 2 are connected to the respective connecting electrodes provided on the back surface of the solar cell C21. Similarly, another two interconnection members 2 are connected to the solar cell group G3, and extends to the power non-generating field Y in the first direction. Specifically, the two interconnection members 2 are connected to the respective correcting electrodes provided on the light receiving surface of the solar cell C31. The solar cell group connecting member 1 is electrically connected to these four interconnection members 2 by use of an conductive adhesive such as solder in the power non-generating field Y.

In addition, the two interconnection members 2 connected to the solar cell C31 are arranged alongside in the second direction. In the power non-generating field Y, the bypass diode connecting interconnection 20 is arranged between the two interconnection members 2, and is electrically connected to the solar cell group connecting member 1 by use of an conductive adhesive such as solder.

The bypass diode connecting interconnection 20 extends toward the back surface of the solar cell C31, that is, the back surface of the power generating field X, from the position where the bypass diode connecting interconnection 20 is connected to the solar cell group connecting member 1 in the power non-generating field Y. As a result, as shown in FIG. 4, the bypass diode connecting interconnection 20 has a first bypass diode connecting interconnection section 20a and a second bypass diode connecting interconnection section 20b on a projected plane in parallel to the main surface of the solar cell module 100. The first bypass diode connecting interconnection section 20a is provided along the interconnection members 2 in the power non-generating field Y. The second bypass diode connecting interconnection section 20b is provided to connect to the first bypass diode connecting interconnection section 20a in the power generating field X. A cushioning member (not illustrated) for releasing stress produced in the module process is arranged between the second bypass diode connecting interconnection section 20b and the power generating field X. An EVA resin or the like can be used for the cushioning member. In addition, an insulation treatment is applied to the surface of the second bypass diode connecting interconnection section 20b.

In this respect, the bypass diode connecting interconnection 20 does not intersects the interconnection members 2 at the boundary between the power generating field X and the power non-generating field Y on the projected plane in parallel to the main surface of the solar cell module 100. As a result, the bypass diode connecting interconnection 20 is placed away from the interconnection members 2 at the end of the solar cell C31 in the first direction. The end of the solar cell C31 constitutes the boundary between the power generating field X and the power non-generating field Y.

Furthermore, the second bypass diode connecting interconnection section 20b is placed away from the end of the solar cells C11, C21, C31 and C41 in the first direction, on the projected plane in parallel to the main surface of the solar cell module 100. The end of the solar cells C11, C21, C31 and C41 constitutes the boundary between the power generating field X and the power non-generating field Y. The second bypass diode connecting interconnection section 20b is placed in the power generating field X on the projected plane in parallel to the main surface of the solar cell module 100.

In addition, the second output interconnection section 10b and the second bypass diode connecting interconnection section 20b do not intersect each other on the projected plane in parallel to the main surface of the solar cell module 100. The both sections 10b and 20b are arranged in parallel in the second direction.

Figure 5:
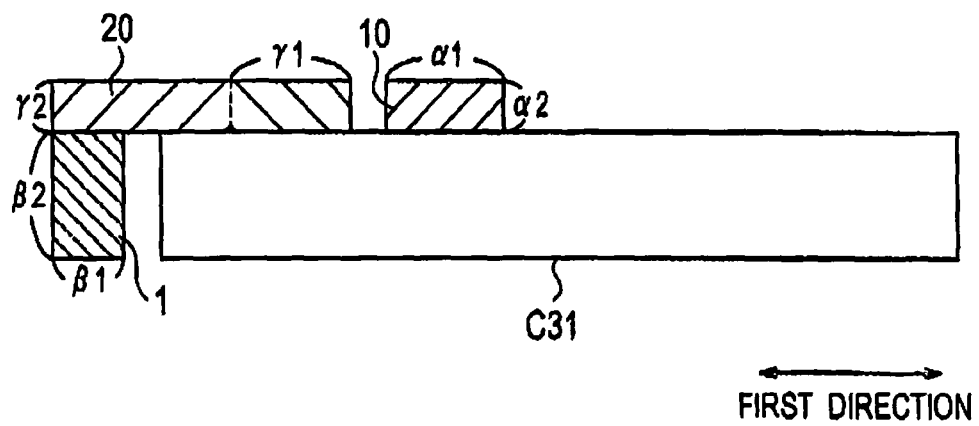
FIG. 5 is a cross-sectional view taken along the C-C line of FIG. 4.

FIG. 5 is a cross-sectional view of the solar cell C31 and its vicinity taken along the C-C line of FIG. 4. As shown in FIGS. 4 and 5, the width $\alpha 1$ of the output interconnection 10 (the first output interconnection section 10a) is larger than the width $\beta 1$ of the solar cell group connecting member 1. The thickness $\alpha 2$ of the output interconnection 10 is smaller than the thickness $\alpha 2$ of the solar cell group connecting member 1. In addition, the width $\gamma 1$ of the bypass diode connecting interconnection 20 is larger than the $\beta 1$ of the solar cell group connecting member 1. The thickness $\gamma 2$ of the bypass diode connecting interconnection 20 is smaller than the thickness $\beta 2$ of the solar cell group connecting member 1.

The foregoing descriptions have been provided for the interconnection configuration of the output interconnection 10 and the bypass diode connecting interconnection 20. The output interconnection 11 electrically connected to the solar cell C81 has the same interconnection configuration as the output interconnection 10. In addition, the bypass diode connecting interconnection 21 electrically connected to the solar cell C61 has the same interconnection configuration as the bypass diode connecting interconnection 20.

(Method of Manufacturing Solar Cell Module)

First of all, multiple solar cells C are prepared. General solar cells each having a semiconductor junction such as a semiconductor p-n junction or a semiconductor pin junction as its basic structure can be used for the solar cells C. It should be noted that the light receiving surface and the back surface of each solar cell C have opposite polarity, respectively. The light receiving surfaces of solar cells C have the same polarity. The connecting electrodes are formed on the light receiving surface and the back surface of the solar cell C.

Subsequently, the 5 solar cells C11 to C15 are sequentially arrayed in the array direction. The solar cell connecting members 3 are electrically connected to each of the 5 solar cells C11 to C15 by use of an conductive adhesive such as solder. At this time, the conductive member 4 is connected to the solar cell C11, and the interconnection members 2 are connected to the solar cell C15. In this manner, the output solar cell group G1 is formed. Similarly, the output solar cell group G8 is formed.

Figure 6A:
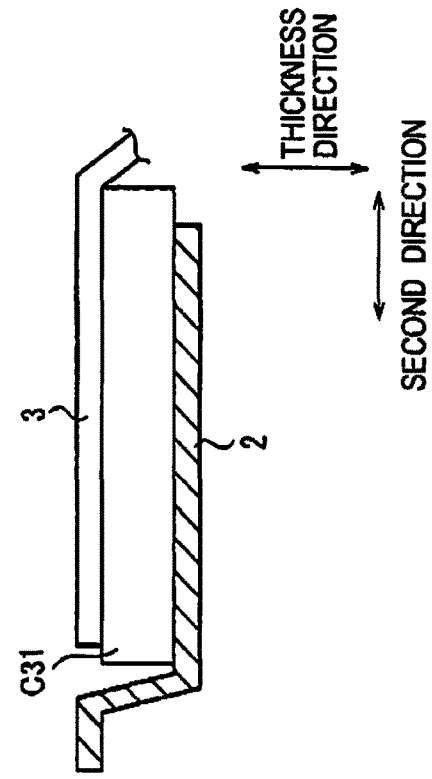
FIG. 6A is a cross-sectional view used for the purpose of explaining the shape of an interconnection member 2 connected to the solar cell C21.

In addition, the 5 solar cells C21 to C25 are arrayed in the array direction. The solar cell connecting members 3 are electrically connected to each of the 5 solar cells C21 to C25 by use of the conductive adhesive such as solder. At this time, interconnection members 2 are connected to each of the solar cells C21 and C25. In this respect, the interconnection members 2 connected to the solar cell C21 are formed in the shape of a straight line as shown in FIG. 6A. In this manner, the solar cell group G2 is formed. Similarly, the solar cells groups G4 and G6 are formed.

Figure 6B:
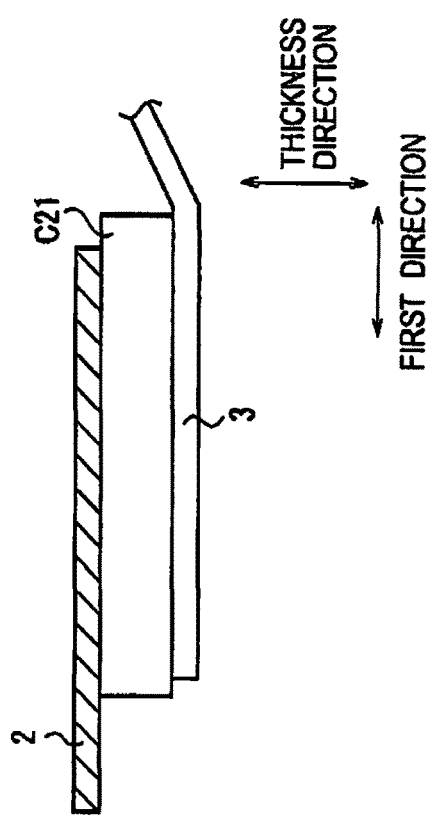
FIG. 6B is a cross-sectional view used for the purpose of explaining the shape of an interconnection member 2 connected to the solar cell C31.

In addition, the 5 solar cells C31 to C35 are arrayed in the array direction. The solar cell connecting members 3 are electrically connected to each of the 5 solar cells C31 to C35 by use of the conductive adhesive such as solder. At this time, interconnection members 2 are connected to each of the solar cells C31 and C35. In this respect, a part of the interconnection members 2 connected to the solar cell C31 is folded to the back surface side, as shown in FIG. 6B. In other way, the positions of the interconnection members 2 connected to the solar cell C31 in the thickness direction corresponds to the positions of the interconnection members 2 connected to the solar cell C21 in the thickness direction. In this manner, the solar cell group G3 is formed. Similarly, the solar cell groups G5 and G7 are formed.

Subsequently, each solar cell group connecting member 1 is electrically connected to its corresponding interconnection members 2 by use of the conductive adhesive such as solder. FIG. 7A shows how a solar cell group connecting member 1 is connected to the interconnection members 2 connected to the solar cell C21. FIG. 7B shows how another solar cell group connecting member 1 is connected to another interconnection member 2 connected to the solar cell C31. With these connections, the 8 solar cell groups G1 to G8 are electrically connected one to another in series, and the power generating field X is accordingly formed.

Subsequently, the output interconnections 10 and 11 are connected to conductive members 4 by use of solder, respectively. Concurrently, the bypass diode connecting interconnections 20 and 21 are electrically connected to their corresponding solar cell group connecting members 1 by use of the conductive adhesive such as solder, respectively. The output interconnections 10 and 11 extend to the back surface of the power generating field X from the positions where the output interconnections 10 and 11 are connected to the conductive members 4, respectively. The bypass diode connecting interconnections 20 and 21 extend to the back surface of the power generating field X from the positions where the bypass diode connecting interconnections 20 and 21 are connected to the solar cell group connecting members 1, respectively.

A laminated body is formed by sequentially laminating, following sheets onto a glass substrate (serving as the light receiving surface-side protecting member 102); an EVA resin sheet (serving as a part of the sealing member 101); the 8 solar cell groups G1 to G8, an EVA resin sheet (serving as the other part of the sealing member 1); and a PET/aluminum/PET laminated sheet (serving as the back surface-side protecting member 103). At this time, parts of the output interconnections 10 and 11 as well as parts of the bypass diode connecting interconnections 20 and 21 are drawn outside the laminated body through notches formed on the sealing member 1 and the back surface-side protecting members 103.

Subsequently, the components constituting the laminated body are bonded by compression while heated in a vacuum atmosphere. Thereby, the 8 solar cell groups G1 to G8 are sealed between the glass substrate and the PET/aluminum/PET sheet.

The external parts of the output interconnections 10 and 11 as well as the external parts of the bypass diode connecting interconnections 20 and 21 are housed in the terminal box 104.

In the foregoing manner, the solar cell module 100 is produced. It should be noted that an Al frame can be attached to the solar cell module 100.

(Operation and Effect)

In the case of the solar cell module 100 according to the present embodiment, on the projected plane in parallel to the main surface of the solar cell module 100, the output interconnection 10 includes: the first output interconnection section 10a provided along the conductive member 4 in the power non-generating field Y; and the second output interconnection section 10b provided to connects to the first output interconnection section 10a in the power generating field X. In addition, the bypass diode connecting interconnection 20 includes: the first bypass diode connecting interconnection section 20a provided along its corresponding interconnection members 2 in the power non-generating field Y; and the second bypass diode connecting interconnection section 20b provided to connects to the first bypass diode connecting interconnection section 20a in the power generating field X.

In this manner, the output interconnection 10 and the bypass diode connecting interconnection 20 are not drawn outside the power generating field X. This design makes it possible to increase the ratio of the area of the power generating field X to the area of the solar cell module 100, and as a result, it makes it possible to increase the amount of power generation per unit area of the solar cell module 100.

In addition, in the case of the solar cell module 100 according to the present embodiment, the width of the output interconnection 10 is larger than the width of each solar cell group connecting member 1. The thickness of the output interconnection 10 is smaller than the thickness of each solar cell group connecting member 1. In addition, the width of the bypass diode connecting interconnection 20 is larger than the width of each solar cell group connecting member 1. The thickness of the bypass diode connecting interconnection 20 is smaller than the thickness of each solar cell group connecting member 1.

In this manner, the thicknesses respectively of the output interconnection 10 and the bypass diode connecting interconnection 20 are smaller than the thickness of each solar cell group connecting member 1. This makes it possible to check stress from concentrating on a certain part of the solar cells C arranged in the way that the solar cells C overlap the output interconnection 10, while the components of the solar cell module 100 are being bonded into the laminated body by compression. As a result, this makes it possible to check the solar cells C from cracking or chipping during the module process. Additionally, the widths respectively of the output interconnection 10 and the bypass diode connecting interconnection 20 are made larger than the width of each solar cell group connecting member 1. This design prevents increase in the resistance values of the respective interconnections 10 and the bypass diode connecting interconnection 20. Moreover, each solar cell group connecting member 1 is formed thicker and narrower in the power non-generating field Y. This design makes it possible to decrease the area of the power non-generating field Y while preventing increase in the resistance values of the solar cell group connecting member 1. As a result, this makes it possible to further increase the amount of power generation per unit area of the solar cell module 100.

Moreover, in the case of the solar cell module 100 according to the present embodiment, the second output interconnection section 10b and the second bypass diode connecting interconnection 20b do not intersect each other. This design makes it possible to prevent stress concentration in a certain part of the solar cells C. As a result, this makes it possible to check the solar cells C from cracking or chipping during the module process.

In this respect, the concentration of stress on a certain part of the solar cells C tends to cause the solar cells C to crack or chip at their ends. For this reason, it is desirable that the components should not overlap the ends of the solar cells C.

In the case of the solar cell module 100 according to the present embodiment, the output interconnection 10 does not intersect the first and the second conductive sections 4a and 4b at the boundary between the power generating field X and the power non-generating field Y, that is, at the ends of the solar cells C. This design makes it possible to check the solar cells C from cracking or chipping at their ends.

Furthermore, in the case of the solar cell module 100 according to the present embodiment, the second output interconnection section 10b and the second bypass diode connecting interconnection section 20b do not intersect at the boundary between the power generating field X and the power non-generating field Y, that is, at the ends of the solar cells C11, C21, C31 and C41. This design makes it possible to check the solar cells C from cracking or chipping at their ends.

Additionally, in the case of the solar cell module 100 according to the present embodiment, the cushioning member (made of an EVA resin or the like) is arranged between the second output interconnection section 10b and the power generating field X, and between the second bypass diode connecting intersection section 20b and the power generating field X. These arrangements make it possible to release stress which is applied to the solar cell module 100 during the module process.

In addition, in the case of the solar cell module 100 according to the present embodiment, the insulation treatment is applied to the second output interconnection section 10b and the second bypass diode connecting interconnection section 20b. This application makes it possible to sufficiently secure insulation between the second output interconnection section 10b and each of the solar cells C included in the power generating field X, as well as insulation between the second bypass diode connecting interconnection section 20b and each of the solar cells C included therein.

Furthermore, in the case of the production method of the solar cell module 100 according to the present embodiment, the part of the interconnection member 2 connected to the solar cell C31 is folded along the side surface of the solar cell C31 to the thickness direction. In other words, in the power non-generating field Y, the positions of the interconnection members 2 connected to the solar cell C31 in the thickness direction corresponds to the positions of the interconnection members 2 connected to the solar cell C21 in the thickness direction.

This positional correspondence makes it unnecessary that the interconnection members 2 connected to the solar cell C31 is folded by pressing the solar cell group connecting member 1 against the interconnection members 2, when the solar cell group connecting member 1 is connected to the interconnection members 2. This makes it possible to prevent the concentration of stress at the end of the solar cell C31. As a result, this makes it possible to check the solar cell from cracking or chipping.

Modification of Embodiment

The foregoing descriptions have been provided according to the embodiment of the present invention, in a case where the solar cell module 100 is constituted of 8 solar cell groups G1 to G8 electrically connected one to another in series. However, the present invention is not limited to this embodiment. The present invention is applicable to a solar cell module in a case where some solar cell groups are connected to each other in parallel, as well.

Figure 8:
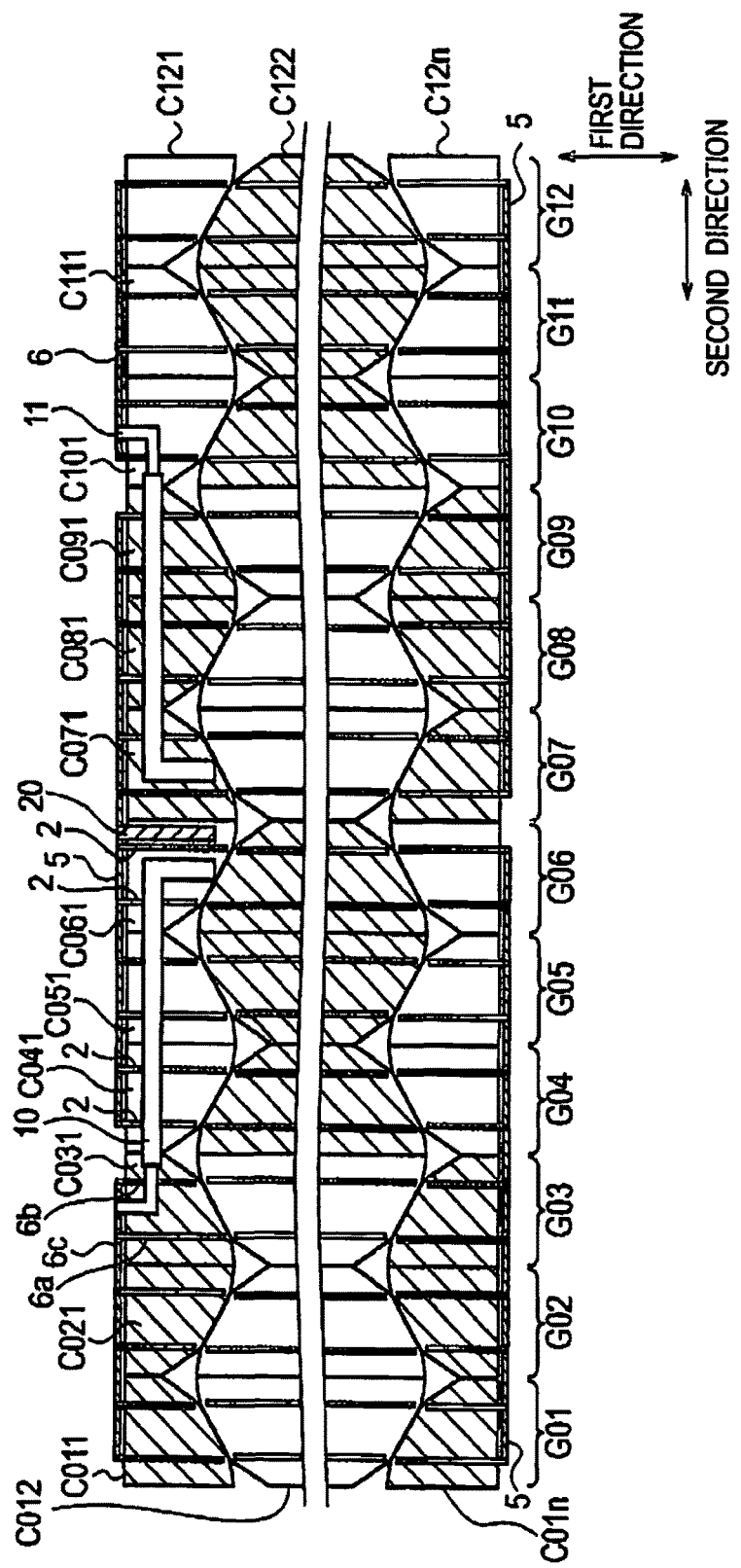
FIG. 8 is a back view of a solar cell module 100 according to a modification of the embodiment of the present invention.

Descriptions will be provided for the solar cell module 100 according to this modification by referring to FIG. 8. FIG. 8 is a back view of a configuration of the solar cell module 100 according to this modification.

The solar cell module 100 according to this modification includes: a power generating field X; a power non-generating field Y; solar cell group connecting members 5; conductive members 6; output interconnections 10 and 11 through which electric power generated in the power generating field X is outputted to the outside of the solar cell module 100; and a bypass diode connecting interconnection 20.

The power generating field X includes 12 solar cell groups G01 to G12, that is a first to 12th solar cell groups, each formed by arraying certain number n of solar cells C in the first direction. The 12 solar cell groups G01 to G12 are arranged alongside in the second direction. Therefore, in the present modification of embodiment, the power generating field X is formed by arraying the solar cells C in a 12×n matrix.

It should be noted that the light receiving surface and the back surface of each solar cell C have opposite polarity, respectively. The light receiving surfaces of solar cells C have the opposite polarity one-by-one, in the first direction. The light receiving surfaces of solar cells C have the same polarity three-by-three, in the first direction.

The solar cell module 100 according to this modification includes three solar cell group connecting members 5. The first solar cell group connecting member 5 is electrically connected to the back surfaces of each of the solar cells C01n to C06n. The second solar cell group connecting member 5 is electrically connected to the back surfaces of each of the solar cells C041 to C091. The third solar cell group connecting member 5 is electrically connected to the back surface of each of the solar cells C07n to C12n. In this manner, this solar cell group connecting member 5 electrically connects each three neighboring solar cell groups G in parallel, and electrically connects a cluster consisting of the three neighboring solar cell groups to the other cluster of the other three neighboring solar cell groups in series. The three solar cell group connecting members 5 are arranged in the power non-generating field Y. The bypass diode connecting interconnection 20 is electrically connected to a solar cell connecting group member 5 to which the fourth to 9th solar cell groups G04 to G09 are connected.

The paired positive and negative output interconnections 10 and 11 are electrically connected to the third and 10th solar cell groups G03 and G10 through the conductive members 6, respectively. For this reason, in the case of this modification, the solar cell groups G03 and G10 are referred to as output solar cell groups.

The output interconnection 10 is electrically connected to the output solar cell group G03 through the conductive member 6. This conductive member 6 is connected to the output solar cell group G3, and extends to the power non-generating field Y. Specifically, the conductive member 6 is connected to the solar cell C031 located at one end of the output solar cell group G03 in the first direction, and extends to the power non-generating field Y in the first direction.

The output solar cell group G10 includes a certain number n of solar cells C101 to C10n, and has the same configuration as the output solar cell group G03. As a result, the output interconnection 11 is electrically connected to the output solar cell group G10 through the conductive member 6.

(Interconnection Configuration of Conductive Member 6 and Output Interconnection 10)

Descriptions will be subsequently provided for an interconnection configuration of the conductive member 6 and the output interconnection 10. The interconnection configuration of the conductive member 6 and the output interconnection 10 is the same as the interconnection configuration of the conductive member 4 and the output interconnection 10 according to the foregoing embodiment. For the following descriptions, refer to FIG. 4 whenever deemed necessary.

The conductive member 6 is connected to the output solar cell group G03, and extends to the power non-generating field Y in the first direction. In the power non-generating field Y, the output interconnection 10 is connected to a third conductive section 6c by use of solder. In this manner, the output interconnection 10 is electrically connected to the solar cell C031 (or the output solar cell group G03) through the conductive member 6.

The output interconnection 10 extends along a first and second conductive section 6a and 6b to the back surface of the solar cell C031, that is, to the back surface of the power generating field X, from the position where the output interconnection 10 is connected to the third conductive section 6c in the power non-generating field Y. As a result, the output interconnection 10 includes a first output interconnection section 10a and a second output interconnection section 10b on the projected plane in parallel to the main surface of the solar cell module 100. The first output interconnection section 10a is provided along the first and the second conductive sections 6a and 6b in the power non-generating field Y. The second output interconnection section 10b is provided to be connected to the first output interconnection section 10a in the power generating field X. A cushioning member for releasing stress produced during the module process is arranged between the second output interconnection section 10b and a part of the power generating field X. An EVA resin or the like can be used for the cushioning member. In addition, an insulation treatment is applied to a part of the outer periphery of the second output interconnection section 10b.

In this respect, the output interconnection 10 does not intersect the first conductive section 6a and the second conductive section 6b at the boundary between the power generating field X and the power non-generating field Y on the projected plane in parallel to the main surface of the solar cell module 100. Furthermore, the second output interconnection section 10b does not intersect at the boundary between the power generating field X and the power non-generating field Y on the projected plane in parallel to the main surface of the solar cell module 100.

(Interconnection Configuration of Solar Cell Group Connecting Member 5 and Bypass Diode Connecting Interconnection 20)

The interconnection configuration of the solar cell group connecting member 5 and the bypass diode connecting interconnection 20 is the same as the interconnection configuration of the solar cell group connecting member 1 and the bypass diode connecting interconnection 20 according to the foregoing embodiment. For this reason, for the following descriptions, refer to the FIG. 4 whenever deemed necessary.

Two interconnection members 2 are connected to the solar cell group G07, and extend to the power non-generating field Y in the first direction. Specifically, the two interconnection members 2 are connected to a connecting electrode provided on the back surface of the solar cell C071. The solar cell group connecting member 5 is connected to these interconnection members 2 by use of solder in the power non-generating field Y.

In addition, the two interconnection members 2 connected to the solar cell C071 are arranged alongside in the second direction. The bypass diode connecting interconnection 20 is arranged in parallel to these two interconnection members 2, and is connected to the solar cell group connecting member 5 in the power non-generating field Y.

The bypass diode connecting interconnection 20 extends to the back surface of the solar cell C071, that is to the back surface of the power generating field X, from the position where the bypass diode connecting interconnection 20 is connected to the solar cell group connecting member 5 in the power non-generating field Y. As a result, the bypass diode connecting interconnection 20 includes a first bypass diode connecting interconnection section 20a and a second bypass connecting interconnection section 20b on the projected plane in parallel to the main surface of the solar cell module 100. The first bypass diode connecting interconnection section 20a is provided along the interconnection members 2 in the power non-generating field Y. The second bypass diode connecting interconnection section 20b is provided to connect to the first bypass diode connecting interconnection section 20a in the power generating field X. A cushioning member for releasing stress produced during the module process is arranged between the second bypass diode connecting interconnection section 20b and the power generating field X. An EVA resin or the like can be used for the cushioning member. In addition, an insulating process is applied to the surface of the second bypass diode connecting interconnection section 20b.

In this respect, the bypass diode connecting interconnection 20 does not intersect the two interconnection members 2 at the boundary between the power generating field X and the power non-generating field Y on the projected surface in parallel to the principal surface of the solar cell module 100. Furthermore, the second bypass diode connecting interconnection section 20b does not intersect at the boundary between the power generating field X and the power non-generating field Y on the projected plane in parallel to the principal surface of the solar cell module 100.

Furthermore, the second output interconnection section 10b and the second bypass diode connecting interconnection section 20b do not intersect each other on the projected plane in parallel to the main surface of the solar cell module 100. It should be noted that the position where the second output interconnection section 10b is located and the position where the second bypass diode connecting interconnection section 20b is located can be changed whenever deemed necessary.

In this respect, the width of the output interconnection 10 is larger than the width of the solar cell group connecting member 5, and the thickness of the output interconnection 10 is smaller than the thickness of the solar cell group connecting member 5. Moreover, the width of the bypass diode connecting interconnection 20 is larger than the width of the solar cell group connecting member 5, and thickness of the bypass diode connecting interconnection 20 is smaller than the thickness of the solar cell group connecting member 5, (Method of Manufacturing Solar Cell Module)

A method of manufacturing a solar cell module 100 according to the present modification is as same as the method of manufacturing a solar cell module 100 according to the foregoing embodiment. For this reason, descriptions will be provided for what makes the method according to the present modification different from the method according to the embodiment.

In the case of the foregoing embodiment, the light receiving surfaces of all of the solar cells C have the same polarity. As a result, each solar cell group connecting member 1 is connected to corresponding interconnection members 2 connected to a light receiving surface and also to another corresponding interconnection members 2 connected to a back surface. By use of this connecting scheme, the solar cells C are electrically connected one to another in series. With this taken into consideration, one of the two interconnection members 2 is partly so folded in advance before connected to the solar cell group connecting member 1 to prevent the stress concentration.

On the other hand, in the case of the modification, solar cells C having the back surface with the same polarity are electrically connected to one anther in parallel. In addition, solar cells C having the back surface with the opposite polarity are electrically connected to each other in series. In the case of this modification, all of the interconnection members 2 are connected to the back surfaces of the corresponding solar cells C, respectively. In addition, each of the solar cell group connecting members 5 is connected to all of its corresponding interconnection members 2 from the light receiving surface side in the power non-generating field Y. As a result, all of the interconnection members 2 used in the solar cell module according to the modification are formed in the shape of a straight line.

(Operation and Effect)

The solar cell module 100 according to the present modification brings about the same working-effect as the solar cell module 100 according to the foregoing embodiment. Specifically, because, as described above, the output interconnections 10 and 11 as well as the bypass diode connecting interconnection 20 are not drawn outside the power generating field X, it is possible to increase the amount of power generation per unit area of the solar cell module 100.

In addition, solar cells C, among which the connecting electrodes with the first polarity are arranged to face in the same direction, are electrically connected to one another in parallel. Another group consisting of solar cells C, among which the connecting electrodes with the second polarity are arranged to face in the same direction, are electrically connected to each other in series. These connection schemes make it possible to use all of the formed interconnection members 2 in the shape of a straight line.

Other Embodiments

The present invention has been described using the foregoing embodiment and its modification. It should not be understood, however, that the descriptions and drawings constituting this disclosure limits the scope of the present invention. To those skilled in the art, various alternative embodiments, examples and operational technologies will be clear from this disclosure.

For example, the number of solar cells C included in each solar cell group G and the number of solar cell groups G can be changed whenever deemed necessary, although, in the case of the foregoing embodiment, all of the solar cells are arrayed in a matrix.

In addition, the arrangement of the second output interconnection section 10b and the second bypass diode connecting interconnection section 20b can be changed as long as the two sections do not intersect each other, although, in the case of the foregoing embodiment, the two sections are arranged almost in parallel to each other.

Furthermore, bypass diode connecting interconnections may be respectively connected to the solar cell groups G2 and G7, although, in the case of the foregoing embodiment, the solar cell groups G3 and G6 are respectively connected to the bypass diode connecting interconnections 20 and 21. Moreover, the solar cell module 100 may not include the bypass diode connecting interconnections 20 and 21.

Figure 9:
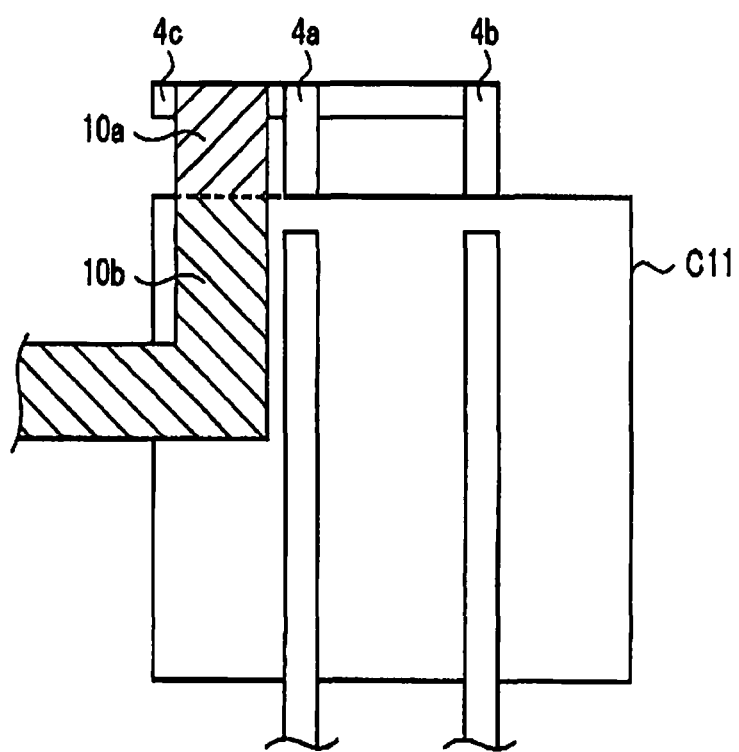
FIG. 9 is a diagram showing another interconnection configuration of an conductive member 4 and an output interconnection 10.

Additionally, as shown in FIG. 9, the first output interconnection section 10a may be connected to an extended portion of the third conductive section 4c, although in the case of the foregoing embodiment, the first output interconnection section 10a is connected to the third conductive section 4c at the portion between a first conductive section 4a and a second conductive section 4b.

What is claimed is:

1. A solar cell module comprising:
a plurality of solar cell groups forming a power generating field including a light receiving surface for receiving light and a back surface provided on the opposite side of the light receiving surface, for generating electric power by receiving light, wherein each of the plurality of solar cell groups includes a plurality of solar cells arrayed in a first direction, the plurality of solar cell groups being arranged one after another in a second direction substantially orthogonal to the first direction;
a power non-generating field which is an area outside of the plurality of solar cell groups;
a conductive member including a first conductive section extending to the power non-generating field from the power generating field in the first direction, a second conductive section extending to the power non-generating field from the power generating field in the first direction and being spaced apart from the first conductive section in the second direction, and a third conductive section extending along the second direction in the power non-generating field and electrically connecting the first conductive section and the second conductive section to each other in the power non-generating field, wherein at least a part of each of the first conductive section and the second conductive section is provided above an outermost solar cell group positioned at an outermost position among the plurality of solar cell groups in the second direction; and
an output interconnection through which the electric power generated in the power generating field is outputted to an outside of the solar cell module through a terminal box positioned at the back surface and including a bypass diode, wherein the output interconnection includes:
a first output interconnection section connected to the third conductive section in the power non-generating field and extending along the first direction from the power non-generating field to the power generating field; and
a second output interconnection section connected to the first output interconnection section and extending along the second direction over solar cells of two or more of the plurality of solar cell groups in the power generating field, the solar cell module further comprises:
a first wiring provided in an area closer, in the second direction, to the terminal box than the first conductive section is and extending to the power non-generating field from the power generating field in the first direction;
a second wiring being spaced apart from the first wiring in the second direction and extending to the power non-generating field from the power generating field in the first direction;
a solar cell group connecting member extending in the second direction from an area of one of the plurality of solar cell groups to an area of another of the plurality of solar cell groups in the power non-generating field and electrically connecting the first wiring and the second wiring to each other; and
a bypass diode connecting interconnection provided in an area closer, in the second direction, to the terminal box than the first output interconnection section is and extending along the first direction from the solar cell group connecting member to the power generating field,
wherein in the power non-generating field including a boundary between the power generating field and the power non-generating field, as seen in a direction orthogonal to the back surface of the solar cell module,
i) the output interconnection includes no portions that are overlapped with the bypass diode connecting interconnection,
ii) the output interconnection includes no portions that are overlapped with the first conductive section and the second conductive section,
iii) the bypass diode connecting interconnection includes no portions that are overlapped with the first wiring and the second wiring,
iv) the third conductive section includes no portions that are overlapped with the bypass diode connecting interconnection, and
v) the output interconnection includes no portions that are overlapped with the solar cell group connecting member, and
the third conductive section includes an extended portion extending from a position corresponding to the first conductive section toward a side of the terminal box in the second direction, the first output interconnection section connected to the extended portion of the third conductive section in the power non-generating field.

2. The solar cell module according to claim 1, wherein the solar cell group connecting member is arranged in the power non-generating field, a width of the output interconnection is larger than a width of the solar cell group connecting member, and a thickness of the output interconnection is smaller than a thickness of the solar cell group connecting member.

3. The solar cell module according to claim 1, wherein, as seen in the direction orthogonal to the back surface of the solar cell module, the second output interconnection section does not intersect the boundary between the power generating field and the power non-generating field.

4. The solar cell module according to claim 1, wherein a cushioning member is arranged between the second output interconnection section and at least a part of the power generating field.

5. The solar cell module according to claim 1, wherein an insulation treatment is applied to at least a part of the second output interconnection section.

6. The solar cell module according to claim 2,
wherein the bypass diode connecting interconnection includes a first bypass diode connecting interconnection section that extends along the first direction to the back surface of the power generating field from a position where the first bypass diode connecting interconnection section is connected to the solar cell group connecting member.

7. The solar cell module according to claim 6, wherein a width of the first bypass diode connecting interconnection section is larger than the width of the solar cell group connecting member, and a thickness of the first bypass diode connecting interconnection section is smaller than the thickness of the solar cell group connecting member.

8. The solar cell module according to claim 6, wherein the bypass diode connecting interconnection further comprises a second bypass diode connecting interconnection section, the second bypass diode connecting interconnection section leading to the first bypass diode connecting interconnection section in the power generating field, wherein, as seen in the direction orthogonal to the back surface of the solar cell module, the second output interconnection section and the second bypass diode connecting interconnection section do not intersect each other.

9. The solar cell module according to claim 6, wherein the bypass diode connecting interconnection further comprises a second bypass diode connecting interconnection section, the second bypass diode connecting interconnection section leading to the first bypass diode connecting interconnection section in the power generating field, wherein, as seen in the direction orthogonal to the back surface of the solar cell module, the second bypass diode connecting interconnection section does not intersect the boundary between the power generating field and the power non-generating field.

10. The solar cell module according to claim 6, wherein the bypass diode connecting interconnection further comprises a second bypass diode connecting interconnection section, the second bypass diode connecting interconnection section leading to the first bypass diode connecting interconnection section in the power generating field, wherein a cushioning member is arranged between the second bypass diode connecting interconnection section and at least a part of the power generating field.

11. The solar cell module according to claim 6, wherein the bypass diode connecting interconnection further comprises a second bypass diode connecting interconnection section, the second bypass diode connecting interconnection section leading to the first bypass diode connecting interconnection section in the power generating field, wherein an insulation treatment is applied to at least a part of the second bypass diode connecting interconnection section.

12. A method of manufacturing a solar cell module, comprising:
forming a power generating field by arranging a plurality of solar cell groups, in each of which a plurality of solar cells are arrayed in a first direction such that the plurality of solar cell groups are arranged one after another in a second direction substantially orthogonal to the first direction, the power generating field including a light receiving surface for receiving light and a back surface provided on the opposite side of the light receiving surface, wherein a power non-generating field is an area outside of the plurality of solar cell groups;
electrically connecting a conductive member to an outermost solar cell group provided at an outermost position among the plurality of solar cell groups in the second direction;
electrically connecting a solar cell group connecting member extending along the second direction to a first wiring and a second wiring, wherein the first wiring is electrically connected to one of the plurality of solar cell groups and extends to the power non-generating field from the one solar cell group in the first direction, and the second wiring is electrically connected to another solar cell group and extends to the power non-generating field from the another solar cell group in the first direction;
electrically connecting an output interconnection to the conductive member outside the power generating field, wherein electric power generated in the power generating field is outputted through the output interconnection to a terminal box positioned at the back surface and including a bypass diode; and
electrically connecting a bypass diode connecting interconnection to the solar cell group connecting member, wherein
the conductive member comprises a first conductive section extending to the power non-generating field from the power generating field in the first direction, a second conductive section extending to the power non-generating field from the power generating field in the first direction and being spaced apart from the first conductive section in the second direction, and a third conductive section extending along the second direction in the power non-generating field and electrically connecting the first conductive section and the second conductive section to each other in the power non-generating field, wherein at least a part of each of the first conductive section and the second conductive section is provided above the outermost solar cell group provided at the outermost position among the plurality of solar cell groups in the second direction;
the solar cell group connecting member extends along the second direction and electrically connecting the first wiring and the second wiring in the power non-generating field;
the output interconnection comprises: a first output interconnection section connected to the third conductive section in the power non-generating field and extending along the first direction from the power non-generating field to the power generating field; and a second output interconnection section extending along the second direction over solar cells of two or more of the plurality of solar cell groups in the power generating field;
the bypass diode connecting interconnection is provided in an area closer, in the second direction, to the terminal box than the first output interconnection section is and extends along the first direction from the solar cell group connecting member to the power generating field;
wherein in the power non-generating field including a boundary between the power generating field and the power non-generating field, as seen in a direction orthogonal to the back surface of the solar cell module, i) the output interconnection includes no portions that are overlapped with the bypass diode connecting interconnection,
ii) the output interconnection includes no portions that are overlapped with the first conductive section and the second conductive section,
iii) the bypass diode connecting interconnection includes no portions that are overlapped with the first wiring and the second wiring,
iv) the third conductive section includes no portions that are overlapped with the bypass diode connecting interconnection, and
v) the output interconnection includes no portions that are overlapped with the solar cell group connecting member, and the third conductive section includes an extended portion extending from a position corresponding to the first conductive section toward a side of the terminal box in the second direction, the first output interconnection section connected to the extended portion of the third conductive section in the power non-generating field.

13. The method of manufacturing a solar cell module according to claim 12, wherein each of the plurality of solar cells includes a first principal surface and a second principal surface provided on the opposite side of the first principal surface, the second principal surface has the opposite polarity from a polarity of the first principal surface, and the plurality of solar cells are arranged in a way that the first principal surfaces of the plurality of solar cells face in the same direction, and wherein, the conductive member is folded along a side surface of a first solar cell in a thickness direction of the first solar cell.

14. The solar cell module of claim 1, wherein ends of the plurality of solar cells constitute the boundary between the power generating field and the power non-generating field.

15. The solar cell module of claim 6, wherein side edges of the first output interconnection section are parallel to but separated from the first conductive section and the second conductive section.

16. The solar cell module of claim 1, wherein, on the light receiving surface, the first conductive section and the second conductive section are positioned substantially parallel to each other, and wherein the third conductive section is positioned substantially orthogonal to the first and second conductive sections on the light receiving surface.

17. The solar cell module of claim 6, wherein the bypass diode connecting interconnection further comprises a second bypass diode connecting interconnection section connected to the first bypass diode connecting interconnection section in the power generating field.

18. The solar cell module of claim 17, wherein the second output interconnection section extends along the second direction over more than two of the plurality of solar cell groups.

19. The solar cell module of claim 1, wherein the first output interconnection section and the extended portion of the third conductive section are connected to each other with a conductive adhesive.

20. The solar cell module of claim 1, wherein the solar cell group connecting member and the bypass diode connecting interconnection are connected to each other with a conductive adhesive.

21. The solar cell module of claim 1, wherein the output interconnection comprises a pair of positive and negative output interconnections, each of the positive and negative output interconnections includes the first output interconnection section and the second output interconnection section, such that the terminal box is provided between the first output interconnection section of the positive output interconnection and the first output interconnection section of the negative output interconnection in the second direction.

22. The solar cell module of claim 1 wherein the outermost solar cell group is an solar cell group that is closest to an edge of the solar cell module in the second direction among the plurality of solar cell groups.

23. The method of manufacturing a solar cell module according to claim 12, wherein the outermost solar cell group is an solar cell group that is closest to an edge of the solar cell module in the second direction among the plurality of solar cell groups.

* * * * *